United States Patent
Narita

(10) Patent No.: US 10,770,554 B2
(45) Date of Patent: Sep. 8, 2020

(54) NITRIDE SEMICONDUCTOR SUBSTRATE, SEMICONDUCTOR DEVICE, AND METHOD FOR MANUFACTURING NITRIDE SEMICONDUCTOR SUBSTRATE

(71) Applicants: SCIOCS COMPANY LIMITED, Ibaraki (JP); SUMITOMO CHEMICAL COMPANY, LIMITED, Tokyo (JP)

(72) Inventor: Yoshinobu Narita, Ibaraki (JP)

(73) Assignees: SCIOCS COMPANY LIMITED, Ibaraki (JP); SUMITOMO CHEMICAL COMPANY, LIMITED, Tokyo (JP)

(*) Notice: Subject to any disclaimer, the term of this patent is extended or adjusted under 35 U.S.C. 154(b) by 88 days.

(21) Appl. No.: 16/088,206

(22) PCT Filed: Feb. 10, 2017

(86) PCT No.: PCT/JP2017/004982
§ 371 (c)(1),
(2) Date: Sep. 25, 2018

(87) PCT Pub. No.: WO2017/169175
PCT Pub. Date: Oct. 5, 2017

(65) Prior Publication Data
US 2020/0127100 A1    Apr. 23, 2020

(30) Foreign Application Priority Data

Mar. 31, 2016  (JP) .................. 2016-070542

(51) Int. Cl.
*H01L 29/36*       (2006.01)
*H01L 29/20*       (2006.01)
(Continued)

(52) U.S. Cl.
CPC .......... *H01L 29/36* (2013.01); *H01L 29/2003* (2013.01); *H01L 29/207* (2013.01); *H01L 29/872* (2013.01)

(58) Field of Classification Search
CPC ........................ H01L 29/205; H01L 29/207
See application file for complete search history.

(56) References Cited

U.S. PATENT DOCUMENTS

2014/0070371 A1   3/2014   Tsuchiya et al.
2014/0138705 A1   5/2014   Zhang et al.
(Continued)

FOREIGN PATENT DOCUMENTS

JP   04-262579 A    9/1992
JP   08-316499 A   11/1996
(Continued)

OTHER PUBLICATIONS

English Translation of the International Preliminary Report on Patentability and Written Opinion for PCT/JP2017/004982 (dated Oct. 11, 2018).
(Continued)

*Primary Examiner* — Caridad Everhart
*Assistant Examiner* — Ankush K Singal
(74) *Attorney, Agent, or Firm* — Pearne & Gordon LLP

(57) ABSTRACT

There is provided a nitride semiconductor substrate, including: a substrate configured as an n-type semiconductor substrate; and a drift layer provided on the substrate and configured as a gallium nitride layer containing donors and carbons, wherein a concentration of the donors in the drift layer is $5.0 \times 10^{16}/cm^3$ or less, and is equal to or more than a concentration of the carbons that function as acceptors in the drift layer, over an entire area of the drift layer, and a difference obtained by subtracting the concentration of the carbons that function as acceptors in the drift layer from the (Continued)

concentration of the donors in the drift layer, is gradually increased from a substrate side toward a surface side of the drift layer.

12 Claims, 7 Drawing Sheets

(51) Int. Cl.
*H01L 29/207* (2006.01)
*H01L 29/872* (2006.01)

(56) References Cited

U.S. PATENT DOCUMENTS

| | | | |
|---|---|---|---|
| 2017/0179271 A1* | 6/2017 | Fenwick | ........... H01L 29/66462 |
| 2018/0350965 A1* | 12/2018 | Shibata | ............... H01L 29/1095 |

FOREIGN PATENT DOCUMENTS

| | | |
|---|---|---|
| JP | 2003-318388 A | 11/2003 |
| JP | 2007-149985 A | 6/2007 |
| JP | 2007-214515 A | 8/2007 |
| JP | 2007-251144 A | 9/2007 |
| JP | 2010-219490 A | 9/2010 |
| JP | 2013-089723 A | 5/2013 |
| JP | 2013-197357 A | 9/2013 |
| JP | 2014-51423 A | 3/2014 |
| JP | 2015-185576 A | 10/2015 |
| JP | 2016-502761 A | 1/2016 |
| JP | 2017-183583 A | 10/2017 |
| WO | 2014081815 A1 | 5/2014 |

OTHER PUBLICATIONS

International Search Report for PCT/JP2017/004982 (dated Mar. 21, 2017).
Written Opinion for PCT/JP2017/004982 (dated Mar. 21, 2017).
Notification of Reasons for Refusal issued in Japanese Patent Application No. JP2016-070543 drafted on May 28, 2018, and an English translation dated Aug. 31, 2018.

* cited by examiner

US 10,770,554 B2

NITRIDE SEMICONDUCTOR SUBSTRATE, SEMICONDUCTOR DEVICE, AND METHOD FOR MANUFACTURING NITRIDE SEMICONDUCTOR SUBSTRATE

TECHNICAL FIELD

The present invention relates to a nitride semiconductor substrate, a semiconductor device, and a method for manufacturing a nitride semiconductor substrate.

DESCRIPTION OF RELATED ART

Group III nitride semiconductors such as gallium nitride have a higher saturated free electron velocity and a higher dielectric breakdown voltage than those of silicon. Therefore, the nitride semiconductors are expected to be applied to power devices that control electric power and the like, and to high-frequency devices such as those for base stations of cellular phones. For example, semiconductor devices such as Schottky barrier diodes (SBD)) and pn junction diodes can be used as specific devices. In these semiconductor devices, a drift layer having a low donor concentration is thickly formed in order to improve a breakdown voltage when reverse bias is applied (for example, see Patent Document 1).

PRIOR ART DOCUMENT

Patent Document

[Patent Document 1] Japanese Unexamined Patent Application Publication. No. 2015-185576

SUMMARY OF THE INVENTION

Problem to be Solved by the Invention

In the nitride semiconductors, carbons can be incorporated due to a group III organometallic material during crystal growth. At least a part of the carbons incorporated into the nitride semiconductor functions as acceptors. Therefore, in donor doped n-type nitride semiconductor, at least a part of the carbons captures electrons from donors and compensates for the donors.

In the semiconductor device as a power device or a high frequency device, as described above, the donor concentration in the drift layer is low in order to improve the breakdown voltage. Therefore, there has been a case that a desired free electron concentration cannot be obtained in the drift layer, due to a great influence of compensating for a small amount of donors by a part of the carbons, even if the donor concentration in the drift layer is a predetermined value for example, in a low concentration region of $5 \times 10^{16}/\text{cm}^3$ or less. As a result, there is a possibility that a performance of the semiconductor device is deteriorated.

An object of the present invention is to provide a technique of improving the performance of the semiconductor device.

Means for Solving the Problem

According to an aspect of the present invention, there is provided a nitride semiconductor substrate, including:

a substrate configured as an n-type semiconductor substrate: and a drift layer provided on the substrate and configured as a gallium nitride layer containing donors and carbons;

wherein a concentration of the donors in the drift layer is $5.0 \times 10^{16}/\text{cm}^3$ or less, and is more than a concentration of the carbons that function as acceptors in the drift layer, over an entire area of the drift layer, and a difference obtained by subtracting the concentration of the carbons that function as acceptors in the drift layer from the concentration of the donors in the drift, layer, is gradually increased from a substrate side toward a surface side of the drift layer.

According to another aspect of the present invention, there is provided a semiconductor device, including:

a substrate, configured as an n-type semiconductor substrate; and a drift, layer provided on the substrate and configured as a gallium nitride layer containing donors and carbons;

wherein a concentration of the donors in the drift layer is $5.0 \times 10^{16}/\text{cm}^3$ or less, and is more than a concentration of the carbons that function as acceptors in the drift, layer, over an entire area of the drift, layer, and a difference obtained by subtracting the concentration of the carbons that function as acceptors in the drift layer from the concentration of the donors in the drift layer, is gradually increased from a substrate side toward a surface side of the drift layer.

According to further another aspect of the present invention, there is provided a method liar manufacturing a nitride semiconductor substrate, including: forming a drift layer as a gallium nitride layer containing donors and carbons, on an n-type semiconductor substrate, wherein in the forming the drift layer, a concentration of the donors in the drift layer is set to be more than a concentration of the carbons that function as acceptors in the drift layer over an entire area of the drift layer, while the concentration of the donors the drift layer is set to $5.0 \times 10^{16}/\text{cm}^3$ or less, and a difference obtained by subtracting the concentration of the carbons that function as acceptors in the drift layer from the concentration of the donors in the drift layer, is gradually increased from a substrate side toward a surface side of the drift layer.

Advantage of the Invention

According to the present invention, a performance of a semiconductor device can be improved.

BRIEF DESCRIPTION OF THE INVENTION

FIG. 1 is a cross-sectional view showing a nitride semiconductor substrate according to an embodiment of the present invention.

FIG. 2 A is a view showing a difference obtained by subtracting a concentration $N_A$ of carbons that function as acceptors in a drift layer from a donor concentration $N_D$ in the drift layer, and FIG. 2 B is a view showing respective concentrations of donors and carbons in the drift layer.

FIG. 3 is a schematic band diagram of the drift layer.

FIG. 4 is a cross-sectional view showing a semiconductor device according to an embodiment of the present invention, FIG. 5 A is a view showing a difference obtained by subtracting the concentration $N_A$ of the carbons that function as acceptors in the drift layer from the donor concentration $N_D$ in the drift layer according to a modified example 1, and FIG. 5 B is a view showing the difference obtained by subtracting the concentration $N_A$ of the carbons that function as acceptors in the drift layer from the donor concentration $N_D$ in the drift layer according to a modified example 2.

DETAILED DESCRIPTION OF THE INVENTION

<An Embodiment of the Present Invention>

An embodiment of the present invention will be described hereafter, with reference to the drawings.

(1) Nitride Semiconductor Substrate

Figure 1:
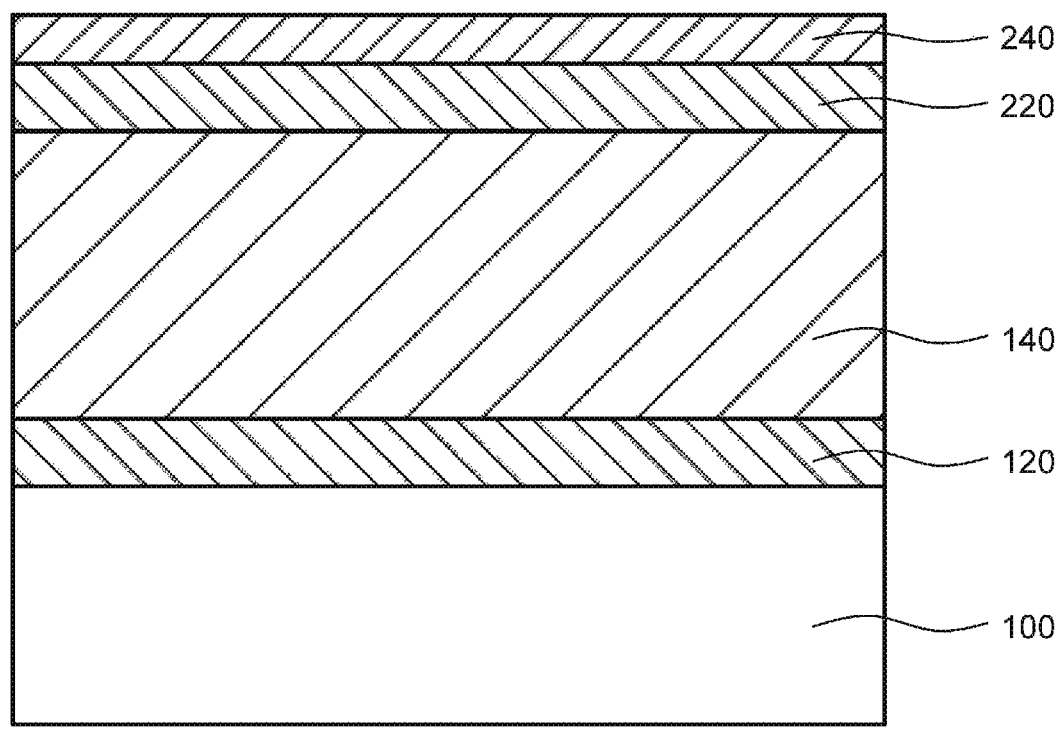

FIG. 1 is a cross-sectional view showing a nitride semiconductor substrate according to an embodiment of the present invention.

As shown in FIG. 1, the nitride semiconductor substrate (nitride semiconductor laminate, nitride semiconductor epitaxial substrate) 10 of this embodiment, is configured as a wafer on which nitride semiconductor layers are epitaxially grown to manufacture a semiconductor device 20 as a pn junction diode described later, and for example includes a substrate 100, an underlying n-type semiconductor layer 120, a drift layer 140, a first p-type semiconductor layer 220, and a second p-type semiconductor layer 240.

Hereinafter, a "laminating direction" means a direction in which nitride semiconductor layers such as the underlying n-type semiconductor layer 120 are laminated in an upward direction (direction away from a main surface of the substrate 100) from the substrate 100 side in the drawing. In other words, regarding the drift layer 140, the "laminating direction" means "the direction from the substrate 100 side toward the surface side of the drift layer 140". The surface (second main surface) of the drift layer 140 is the surface opposite to the substrate 100 side surface (first main surface) in the drift layer 140.

(Substrate)

A substrate 100 is configured as an n-type monocrystalline gallium nitride (GaN) substrate (free-standing GaN substrate) containing predetermined donors. As the donors in the substrate 100, for example, silicon (Si) or germanium (Ge) can be used. The donor concentration in the substrate 100 is, for example, $5.0 \times 10^{17}/cm^3$ or more and $5.0 \times 10^{18}/cm^3$ or less. The donor concentration, the carbon concentration described later, and the like can be measured by, for example, secondary ion mass spectrometry (SIMS).

A plane orientation of the main surface of the substrate 100 is, for example, a c-plane ((0001) plane). The GaN crystal constituting the substrate 100 may have a predetermined off-angle with respect to the main surface of the substrate 100. The off-angle is an angle formed by a normal direction of the main surface of the substrate 100 and the c-axis of the GaN crystal constituting the substrate 100. Specifically, the off-angle of the substrate 100 is, for example, 0.15° or more and 0.8° or less. If the off-angle of the substrate 100 is less than 0.15°, there is a possibility of increasing the concentration of the carbons (C) added when growing the nitride semiconductor layer such as the drift layer 140 on the substrate 100. In contrast, since the off-angle of the substrate 100 is 0.15° or more, the concentration of the carbons added when growing the nitride semiconductor layer such as the drift layer 140 on the substrate 100, can be decreased to a predetermined amount or less. Meanwhile, if the off-angle of the substrate 100 is more than 0.8°, there is a possibility that a morphology of the main surface of the substrate 100 is deteriorated. In contrast, since the off-angle of the substrate 100 is 0.8° or less, the morphology of the main surface of the substrate 100 can be flattened.

Further, a dislocation density on the main surface of the substrate 100 is, for example, $1 \times 10^7/cm^2$ or less. If the dislocation density on the main surface of the substrate 100 is more than $1 \times 10^7/cm^2$, there is a possibility of increasing the dislocations that lower a local breakdown voltage, in the nitride semiconductor layer such as the drift layer 140 formed on the substrate 100. In contrast, since the dislocation density on the main surface of the substrate 100 is $1 \times 10^{17}/cm^2$ or less as in this embodiment, it is possible to suppress an increase of the dislocations that lower the local breakdown voltage in the nitride semiconductor layer such as the drift layer 140 formed on the substrate 100.

(Underlying n-Type Semiconductor Layer)

The underlying n-type semiconductor layer 120 is provided between the substrate 100 and the drift layer 140, as a buffer layer for taking over the crystallinity of the substrate 100 and stably epitaxially growing the drift layer 140. Further, the underlying n-type semiconductor layer 120 is configured as an n$^+$type GaN layer containing donors in the same concentration as that of the substrate 100. As the donors in the underlying n-type semiconductor layer 120, for example, Si or Ge can be used similarly to the donors in the substrate 100. Further, the donor concentration in the underlying n-type semiconductor layer 120 is, for example, $5.0 \times 10^{17}/cm^3$ or more and $5.0 \times 10^{18}/cm^3$ or less, similarly to the donor concentration in the substrate 100.

The underlying n-type semiconductor layer 120 contains carbons which are added (autodoped) due to the group ill organometallic material used at the time of crystal growth. A total concentration of the carbons in the underlying n-type semiconductor layer 120 is, for example, $1.0 \times 10^{15}/cm^3$ or more and $5.0 \times 10^{16}/cm^3$ or less. The "total concentration of the carbons" means the concentration of all kinds of carbons, including not only the concentration of the carbons that function as acceptors but also the concentration of the carbons that do not function as acceptors, as described later.

In an n-type nitride semiconductor layer such as the underlying n-type semiconductor layer 120, at least a part of the carbons function as acceptors (compensating dopant) and compensates for the donors. Therefore, an effective free electron concentration in the underlying n-type semiconductor layer 120 is obtained as a difference obtained by subtracting the concentration of the carbons that function as acceptors from the donor concentration. However, in the underlying n-type semiconductor layer 120, the donor concentration is high and the concentration of the carbons that function as acceptors is relatively low enough to be negligible. Therefore, the free electron concentration in the underlying n-type semiconductor layer 120 can be regarded as approximately equal to the donor concentration, and for example, it is $5.0 \times 10^{17}/cm^3$ or more and $5.0 \times 10^{18}/cm^3$ or less.

The donor concentration and the total concentration of the carbons in the underlying n-type semiconductor layer 120 are substantially constant toward a laminating direction, respectively. If the underlying n-type semiconductor layer 120 includes a region in which each added concentration is constant toward the laminating direction, the underlying n-type semiconductor layer 120 may include a concentration gradient region near the substrate 100 side or the drift layer 140 side.

A thickness of the underlying n-type semiconductor layer 120 is smaller than a thickness of the drift layer 140 described later, and is, for example, 0.1 μm or more and 3 μm or less.

(Drift Layer)

The drift layer 140 is provided on the underlying n-type semiconductor layer 120 and is configured as an n⁻-type GaN layer containing donors in a low concentration. As the donors in the drift layer 140, for example Si or Ge can be used, similarly to the donors in the underlying n-type semiconductor layer 120.

The donor concentration in the drift layer 140 is lower than the donor concentration of the substrate 100 and the donor concentration of the underlying n-type semiconductor layer 120, and for example, it is $1.0 \times 10^{15}/cm^3$ or more and $5.0 \times 10^{16}/cm^3$ or less. If the donor concentration is less than $1.0 \times 10^{15}/cm^3$, there is a possibility that resistance of the drift layer 140 becomes higher. In contrast, since the donor concentration is $1.0 \times 10^{15}/cm^3$ or more, excessive increase in the resistance of the drift layer 140 can be suppressed. Meanwhile, if the donor concentration exceeds $5.0 \times 10^{16}/cm^3$, there is a possibility that the breakdown voltage is lowered when reverse bias is applied. In contrast, since the donor concentration is $5.0 \times 10^{16}/cm^3$ or less, a predetermined breakdown voltage can be secured.

The drift layer 140 also contains carbons added due to the group III organometallic material used at the time of crystal growth. At least a part of the carbons in the drift layer 140 functions as an acceptor and compensates for the donors. Here, as described above, in the underlying n-type semiconductor layer 120, the donor concentration is high at a level of $10^{18}$ order. Therefore, in the underlying n-type semiconductor layer 120, the carbon concentration compared to the donor concentration is low enough to be negligible. In contrast, in the drift layer 140, the donor concentration is as low as $5.0 \times 10^{16}/cm^3$ or less. Therefore, in the drift layer 140, the carbon concentration compared to the donor concentration is not negligible, and the concentration of free electrons in the drift layer 140 is easily influenced by the compensation for a small amount of the donors by a part of the carbons that function as acceptors. Accordingly, in the drift, layer 140, it is impossible to obtain a desired free electron concentration distribution unless the relative relationship between the donor concentration and the concentration of the carbons that function as acceptors is controlled.

Therefore, in this embodiment, the donor concentration in the drift layer 140 is adjusted to be equal to or more than the concentration of the carbons that function as acceptors in the drift layer 140 over the entire area of the drift layer 140, and a difference obtained by subtracting the concentration of the carbons that function as acceptors in the drift layer 140 from the donor concentration in the drift layer 140, is adjusted to be gradually increased from the substrate 100 side toward the surface side of the drift layer 140 (namely, toward the laminating direction). As a result, a desired free electron concentration distribution can be obtained in the drift layer 140. The relative relationship between the donor concentration and the carbon concentration in the drift layer 140 will be described later in detail.

In order to improve the breakdown voltage when reverse bias is applied, the drift layer 140 is provided so as to be thicker than the underlying n-type semiconductor layer 120 for example. Specifically, the thickness of the drift layer 140 is for example 3 μm or more and 40 μm or less. If the thickness of the drift, layer 140 is less than 3 μm, there is a possibility that the breakdown voltage is lowered when reverse bias is applied (depending on the donor concentration in the drift layer 140). In contrast, since the thickness of the drift layer 140 is 3 μm or more, a predetermined breakdown voltage can be secured. Meanwhile, if the thickness of the drift layer 140 exceeds 40 μm, there is a possibility that on-resistance becomes higher when forward bias is applied. In contrast, since the thickness of the drift layer 140 is 40 μm or less, it is possible to suppress an excessive increase of the on-resistance when forward bias is applied.

(First p-Type Semiconductor Layer)

A first, p-type semiconductor layer 220 is provided on the drift layer 140 and is configured as a p-type GaN layer containing acceptors. As the acceptors in the first p-type semiconductor layer 220, for example magnesium (Mg) can be used. Further, the acceptor concentration in the first p-type semiconductor layer 220 is, for example, $1.0 \times 10^{17}/cm$ or inure and $2.0 \times 10^{19}/cm^3$ or less.

(Second p-Type Semiconductor Layer)

A second p-type semiconductor layer 240 is provided on the first p-type semiconductor layer 220 and is configured as a p⁺-type GaN layer containing the acceptors in a high concentration. As the acceptor in the second p-type semiconductor layer 240, for example Mg can be used similarly to the first p-type semiconductor layer 220. Further, the acceptor concentration in the second p-type semiconductor layer 240 is higher than the acceptor concentration in the first p-type semiconductor layer 220, and for example, it is $5.0 \times 10^{19}/cm^3$ or more and $2.0 \times 10^{20}/cm^3$ or less. Since the acceptor concentration in the second p-type semiconductor layer 240 is within the above range, a contact resistance between the second p-type semiconductor layer 240 and an anode described later can be lowered.

(Relative Relationship Between the Donor Concentration and the Carbon Concentration in the Drift Layer)

Figure 2:
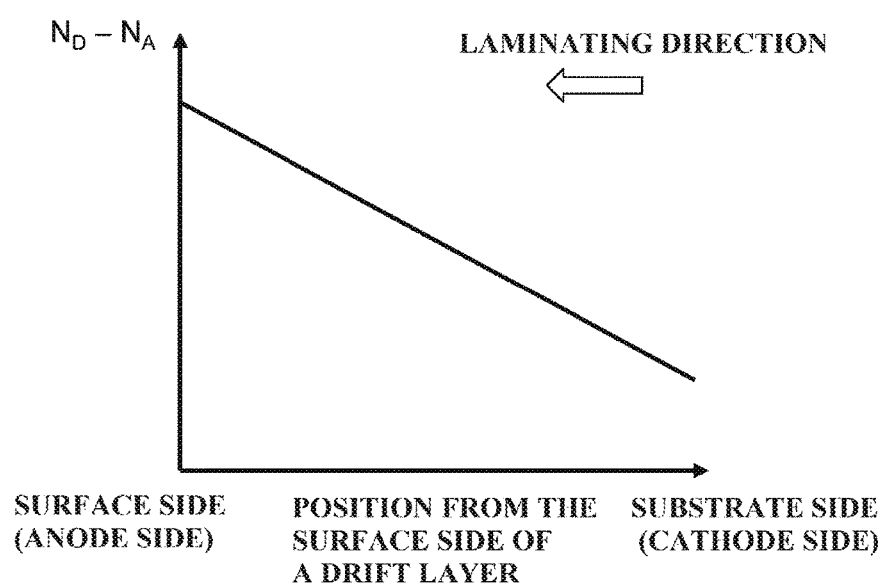
Figure 2:
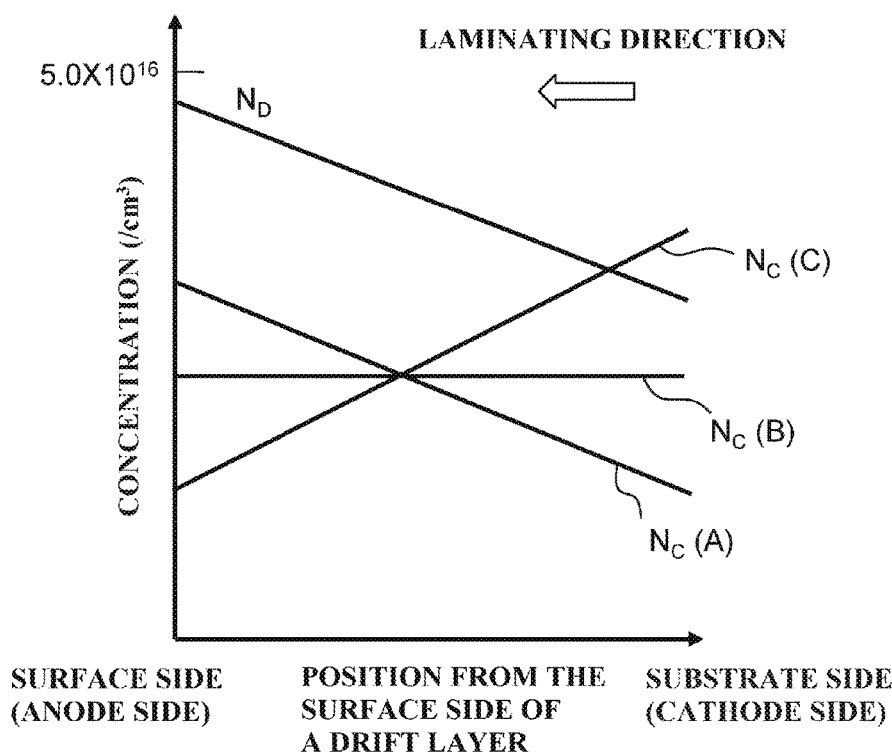

Next, with reference to FIG. 2 A, the relative relationship between the donor concentration and the concentration of the carbons in the drift layer 140 will be described in detail. FIG. 2 A is a view showing a difference obtained by subtracting the concentration $N_A$ of the carbons that function as acceptors in the drift layer from the donor concentration $N_D$ in the drift layer.

In FIG. 2 A, a horizontal axis indicates a position (depth) from a surface side of the drift layer 140. Further, here, the donor concentration in the drift layer 140 is $N_D$, the total concentration of the carbons in the drift layer 140 (the concentration of all kinds of the carbons in the drift layer 140) is $N_C$, and in the carbons in the drift layer 140, the concentration of the carbons that function as acceptors is $N_A$. Further, in this figure, a vertical axis indicates a difference $N_D$-$N_A$ (hereinafter referred to as the concentration difference $N_D$-$N_A$ in the drift layer 140) obtained by subtracting the concentration $N_A$ of the carbons that, function as acceptors in the drift layer 140 from the donor concentration $N_D$ in the drift layer 140). The concentration difference $N_D$-$N_A$ in the drift layer 140 can be regarded as a difference obtained by subtracting an amount of the free electrons captured by the carbons as acceptors from the donors, from the total amount of the free electrons obtained from the donors. Accordingly, the concentration difference $N_D$-$N_A$ in the drift layer 140 corresponds to the effective free electron concentration in the drift layer 140.

Here, in this embodiment, the donor concentration $N_D$ in the drift layer 140 is equal to or more than the concentration $N_A$ of the carbons that function as acceptors in the drift layer 140 ($N_D \geq N_A$). If the donor concentration $N_D$ in the drift layer 140 is less than the concentration $N_A$ of the carbons that function as acceptors in the drift layer 140 in at least a part of the drift layer 140, there is a possibility that a region where free electrons are not obtained may be generated in a part of the drift layer 140. In contrast, since the donor concentration $N_D$ in the drift layer 140 is equal to or more than the concentration $N_A$ of carbons that function as acceptors in the drift layer 140 over the entire area of the drift layer 140, a predetermined amount of the free electrons can be generated over the entire area of the drift layer 140, even if at least a part of the carbons in the drift layer 140 compensates for the donors, in a state that the concentration of the donors is as low as $5.0 \times 10^{16}/cm^3$ or less. As a result, the drift layer 140 can function as an n-type layer.

Further, as shown in FIG. 2 A, in this embodiment, the concentration difference $N_D$-$N_A$ in the drift layer 140 is gradually increased from the substrate 100 side toward the surface side of the drift layer 140 (that is, toward the laminating direction). In other words, the concentration difference $N_D$-$N_A$ in the drift layer 140 is monotonically increased toward the laminating direction. Since the concentration difference $N_D$-$N_A$ in the drift layer 140 has a predetermined distribution as described above, a desired free electron concentration distribution can be obtained even if at least a part of the carbons as acceptors in the drift layer 140 compensates for the donors. In this case, for example, it becomes possible to gradually increase the concentration of free electrons from the substrate 100 side toward the surface side of the drift layer 140.

As a result of intensive study by inventors, etc., it is found that not all of the carbons added to the nitride semiconductor compensates for the donors, but at least ⅓ or more of all of the carbons added to the nitride semiconductor functions as acceptors, and compensates for the donors. Namely, in the drift layer 140 of this embodiment, the concentration $N_A$ of the carbons that function as acceptors is, at least ⅓ times or more of the total concentration $N_C$, of the carbons ($N_C/\le 3N_A \le N_C$).

Therefore, in this embodiment, the donor concentration $N_D$ in the drift layer 140 is at least ⅓ or more times of the total concentration $N_C$ of the carbons in the drift layer 140 over the entire area of the drift layer 140 ($N_D \ge N_C/3$), in consideration of a proportion of the carbons that function as acceptors as described above. If the donor concentration $N_D$ in the drift layer 140 is less than ⅓ of the total concentration $N_C$ of the carbons, there is a possibility that a predetermined amount of the free electrons are not generated in the drift layer 140, because most of the donors in the drift layer 140 are compensated by the carbons that function as acceptors. Therefore, there are possibilities that the drift layer 140 is not n-type, and the resistance of the drift layer 140 becomes higher. In contrast, since the donor concentration $N_D$ in the drift layer 140 is equal to or more than ⅓ times of the total concentration $N_C$ of the carbons, the amount of the donors in the drift layer 140 can be made larger than the amount compensated by carbons as acceptors, and a predetermined amount of the free electrons can be generated in the drift layer 140. As a result, it is possible to make the drift layer 140 function as an n-type layer and prevent, the resistance of the drift layer 140 from becoming excessively high. When the donor concentration $N_D$ in the drift layer 140 is equal to or more than times of the total concentration $N_C$ of the carbons in the drift layer 140, the donor concentration $N_D$ in the drift layer 110 may be lower than the total concentration $N_C$ of the carbons in the drift layer 110.

The donor concentration $N_D$ in the drift layer 140 is preferably made equal to or more than the total concentration $N_C$ of the carbons in the drift layer 140 over the entire area of the drift layer 110. Thereby, the amount of the donors in the drift layer 140 can be surely made larger than the amount compensated by the carbons as acceptors. As a result, the drift layer 140 can stably function as the n type layer.

Figure 3:
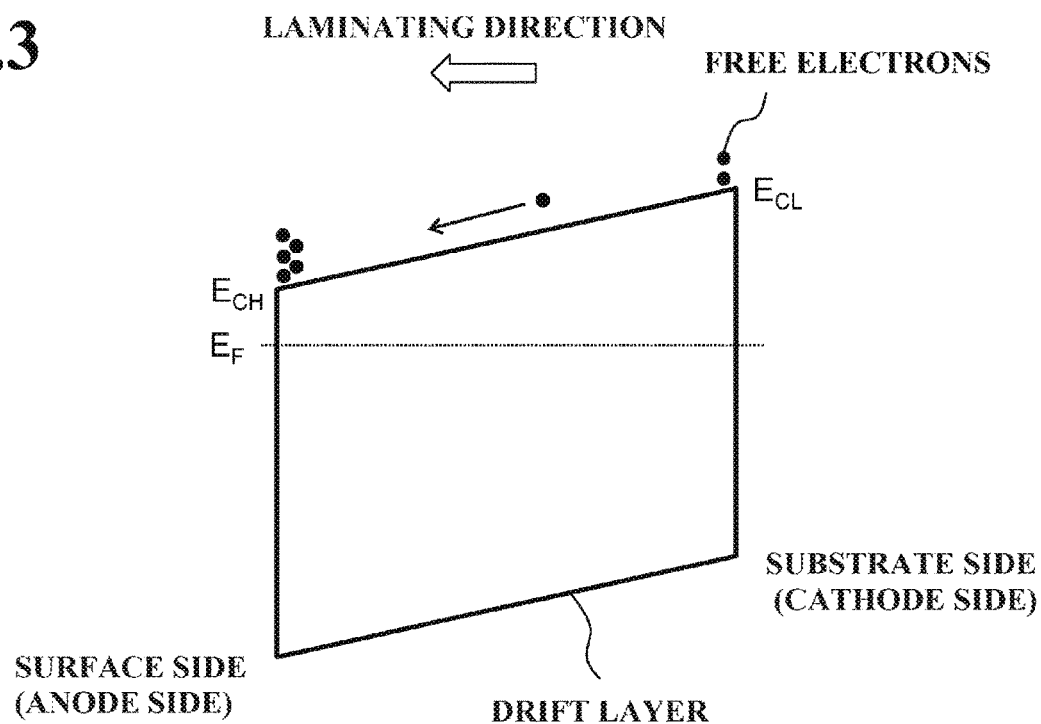

Here, a band diagram of the drift layer 140 will be described, with reference to FIG. 3. FIG. 3 is a schematic band diagram of the drift layer. FIG. 3 omits a band bending on a junction interface between the underlying n-type semiconductor layer 120 and the drift layer 140, and on a junction interface between the drift layer 140 and the first p-type semiconductor layer 220.

In FIG. 3, since the donor concentration $N_D$ in the drift layer 140 is equal to or more than ⅓ times of the total concentration $N_C$ of the carbons in the drift layer 140 over the entire area, of the drift layer 140, a predetermined amount of the free electrons is generated in a conduction band of the drift layer 140. Further, by gradually increasing the concentration difference $N_D$-$N_A$ in the drift layer 140 from the substrate 100 side toward the surface side of the drift layer 140, the concentration of free electrons in the drift layer 140 is gradually increased from the substrate 100 side toward the surface side of the drift layer 140. Therefore, the substrate 100 side of the drift layer 140 is a low free electron concentration region in the drift layer 140 having a low free electron concentration, and meanwhile, the surface side of the drift layer 140 is a high free electron concentration region in the drift layer 14 having a low free electron concentration. Thereby, in the low free electron concentration region on the substrate 100 side of the drift layer 140, a difference between the conduction band $E_{CL}$ and the Fermi level $E_F$ is large, and meanwhile in the high free electron concentration region on the surface side of the drift layer 140, a difference between the conduction band $E_{CH}$ and the Fermi level $E_F$ is small. As a result, the conduction band of the drift layer 140 is inclined to be gradually lowered in the laminating direction.

When forward bias is applied, free electrons are injected from the substrate 100 side into the underlying n-type semiconductor layer 120, and moves into the drift layer 140 passing through the underlying n-type semiconductor layer 120. At this time, in the drift layer 140, the free electrons move faster toward the surface side (anode side) of the drift layer 140, according to a slope of the conduction band which is generated by a gradient of the above-described free electron concentration. In this way, a drift speed of the free electrons can be improved in the drift layer 140.

More specifically, as shown in FIG. 2 A, in this embodiment, the concentration difference $N_D$-$N_A$ in the drift layer 140 is linearly (in a straight line) increased in the laminating direction. Thereby, the slope of the conduction band of the drift layer 140 can be smoothed. As a result, the drift speed of the free electrons can be stably improved over the entire area of the drift layer 140, when forward bias is applied.

In a case that the concentration difference $N_D$-$N_A$ in the drift layer 140 is linearly (in a straight line) increased in the laminating direction as in this embodiment, an absolute value of the gradient of $N_D$-$N_A$ with respect to a depth from the surface side of the drift layer 140 is, for example $5.0 \times 10^{14}$ cm$^{-3} \cdot \mu m^{-1}$ or more $3.0 \times 10^{16}$ cm$^{-3} \cdot \mu m^{-1}$ or less. If the absolute value of the gradient of $N_D$-$N_A$ is less than $5.0 \times 10^{14}$ cm$^{-3} \cdot \mu m^{-}$ there is a possibility that the slope of the conduction band of the drift layer 140 becomes gentle and an effect of improving the drift speed cannot be sufficiently obtained. In contrast, since the absolute value of the gradient of $N_D$-$N_A$ is $5.0 \times 10^{14}$ cm$^{-3} \cdot \mu m^{-1}$ or more, it is possible to sufficiently obtain the effect of giving a predetermined slope to the conduction band of the drift, layer 140 and improving the drift speed. Meanwhile, if the absolute value of the gradient of $N_D$-$N_A$ is more than $3.0 \times 10^{16}$ cm$^{-3} \cdot \mu m^{-1}$, a maximum value or a minimum value of the donor concentration $N_D$ in the drift layer 140 is hardly within the above-described predetermined range. In contrast, since the absolute value of the gradient of $N_D \cdot N_A$ is $3.0 \times 10_{16}$ cm$^{-3}$·μm$^{-1}$ or less, the maximum value or the minimum value of the donor concentration $N_D$ in the drift layer 140 can be within the above-described predetermined range.

(Regarding Each Concentration of the Donors and the Carbons Etc. in the Drift Layer)

With reference to FIG. 2 B, a specific distribution of the donor concentration $N_D$ and the total concentration $N_C$ of the carbons in the drift layer 140 and the like will be described next. FIG. 2 B is a view showing each concentration of the donors and the carbons in the drift layer. In FIG. 2 B, the horizontal axis indicates the position (depth) from the surface side of the drift layer 140, similarly to FIG. 2 A, and the vertical axis indicates each concentration of the donors and the carbons in the drift layer 140. As described above, the donor concentration $N_D$ and the total concentration $N_C$ of the carbons ire the drift layer 140 and the like can be measured, for example, by SIMS.

(Donor Concentration)

As shown in FIG. 2 B, the donor concentration $N_D$ in the drift, layer 140 is for example linearly increased toward the laminating direction. As described above, the maximum value and the minimum value of the donor concentration $N_D$ in the drift layer 140 are within a range of $1.0 \times 10^{15}$/cm$^3$ or more and $5.0 \times 10^{16}$/cm$^3$ or less, and the donor concentration $N_D$ in the drift layer 140 is at least ⅓ times of the concentration $N_C$ of the carbons in the drift, layer 140 over the entire area of the drift layer 110.

(Carbon Concentration)

Meanwhile, by satisfying the following three conditions 1) the donor concentration $N_D$ in the drift layer 140 is $5.0 \times 10^{16}$/cm$^3$ or less; 2) the donor concentration $N_D$ in the drift layer 140 is equal to or more than the concentration $N_A$ of the carbons that function as acceptors in the drift layer 140 over the entire area of the drift layer 140; 3) the concentration difference $N_D$-$N_A$ in the drift layer 140 is gradually increased in the laminating direction, the total concentration $N_C$ of the carbons in the drift layer 140 can be arbitrarily distributed in the laminating direction.

Specifically, for example, as in the case of (A) in FIG. 2 B, the total concentration $N_C$ of the carbons in the drift layer 140 may be gradually increased in the laminating direction. In this case, the amount of the donors compensated by the carbons as acceptors is increased in the vicinity of the junction interface between the drift layer 140 and the first p-type semiconductor layer 220. Thereby, generation of the excessive free electrons in the vicinity of the junction interface (on the surface side of the drift layer 140) can be suppressed. As a result, it is possible to suppress narrowing of a depletion layer in the vicinity of the junction interface and to suppress lowering of the breakdown voltage when reverse bias is applied. Further, by decreasing the total concentration $N_C$ of the carbons on the junction interface side (the substrate 100 side of the drift layer 140) between the drift layer 140 and the underlying n-type semiconductor layer 120, crystallinity on the substrate 100 side of the drift layer 140 can be improved and a loss on the substrate 100 side of the drift layer 140 in the semiconductor device 20 described later can be reduced.

Alternatively, for example, as in the case of (B) in FIG. 2 B, the total concentration $N_C$ of the carbons in the drift layer 140 may be constant in the laminating direction. In this case, the concentration difference $N_D$-$N_A$ in the drift layer 140 can be set to a predetermined distribution only by changing a flow rate of a donor material as a growth condition for growing the drift, layer 140. Namely, there is no necessity for adjusting the growth condition (for example a growth rate, etc., described later) other than the flow rate of the donor material for controlling the concentration of the carbons, thereby making it possible to simplify the control during growth.

Alternatively, for example, as in the case of (C) of FIG. 2 B, the total concentration $N_C$ of the carbons in the drift layer 140 may be gradually decreased in the laminating direction. Namely, the total concentration $N_C$ of the carbons in the drift, layer 140 may be varied in a direction opposite to the donor concentration $N_D$ in the drift layer 140. In this case, there are many donors and the amount of the carbons as acceptors is decreased in the vicinity of the junction interface between the drift layer 140 and the first p-type semiconductor layer 220. Thereby, sufficient free electrons can be generated in the vicinity of the junction interface (the surface side of the drift layer 140). There are few donors and the amount, of the carbons as acceptors is increased in the vicinity of the junction interface between the drift layer 140 and the underlying n-type semiconductor layer 120. Thereby, the free electrons can be reduced in the vicinity of the junction interface (on the substrate 100 side of the drift layer 140). As a result, even if the gradient of the donor concentration $N_D$ is small, the gradient of the concentration difference $N_D$-$N_A$ in the drift layer 140, that is, the gradient of the free electron concentration can be made large, and the slope of the conduction band of the drift layer 110 can be made large. Further, by decreasing the concentration $N_C$ of the carbons on the junction interface side (the surface side of the drift layer 140) between the drift layer 140 and the first p-type semiconductor layer 220, the crystallinity on the surface side of the drift layer 140 can be improved, and the loss on the surface side of the drift layer 140 in the semiconductor device 20 described later can be reduced.

Regarding a specific range of the total concentration $N_C$ of the carbons in the drift layer 140, the total concentration $N_C$ of the carbons in the drift layer 110 is, for example, $5.0 \times 10^{16}$/cm$^3$ or less. If the total concentration $N_C$ of the carbons in the drift layer 140 is more than $5.0 \times 10^{16}$/cm$^3$, there is a possibility that the crystallinity of the drift layer 140 is deteriorated and the loss of the semiconductor device 20 described later is increased. In contrast, since the concentration $N_C$ of the carbons in the drift layer 140 is $5.0 \times 10^{16}$/cm$^3$ or less, the crystallinity of the drift layer 140 can be improved and the loss of the semiconductor device 20 can be reduced. Note that it is much better that the total concentration $N_C$ of the carbons in the drift layer 140 is low as much as possible, and therefore a lower limit value of the total concentration $N_C$ of the cannons is not particularly limited.

(Hydrogen Concentration)

In addition to the donors and carbons, the drift layer 140 also contains hydrogen (H). Hydrogen (H) is incorporated into the drift layer 140, due to the group III organometallic material, the donor material, or the like used at the time of crystal growth of the drift layer 140. The hydrogen concentration in the drift layer 140 is, for example, $5.0 \times 10^{16}$/cm$^3$ or less, preferably $1.0 \times 10^{16}$/cm$^3$ or less. If the hydrogen concentration in the drift layer 140 is more than $5.0 \times 10^{16}$/cm$^3$, there is a possibility that the crystallinity of the drift layer 140 is deteriorated and the loss of the semiconductor device 20 described later is increased. In contrast, since the hydrogen concentration in the drift layer 140 is $5.0 \times 10^{16}$/cm$^3$ or less, the crystallinity of the drift layer 140 can be improved and the loss of the semiconductor device 20 can be reduced. Note that it is much better that the hydrogen concentration in the drift layer 140 is low as much as possible, and therefore the lower limit value of the hydrogen concentration is not particularly limited.

(2) Semiconductor Device

Figure 4:
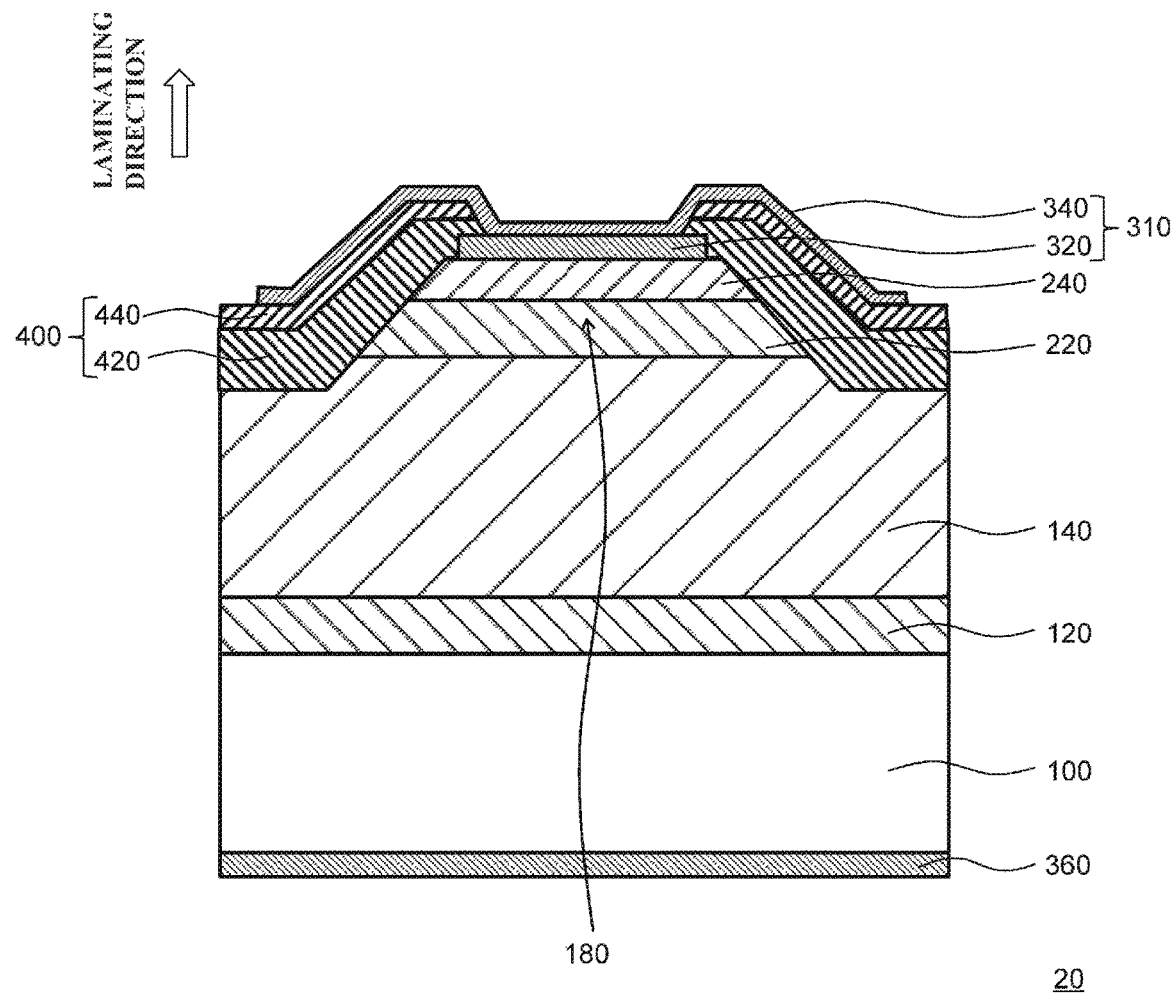

With reference to FIG. 4, the semiconductor device according to this embodiment will be described next. FIG. 4 is a cross-sectional view showing the semiconductor device according to this embodiment.

As shown in FIG. 4, The semiconductor device 20 according to this embodiment is configured as a vertical pn junction diode manufactured using the above-described nitride semiconductor substrate 10, and for example, includes a substrate 100, an underlying n-type semiconductor layer 120, a drift layer 140, a first p-type semiconductor layer 220, a second p-type semiconductor layer 240, an anode 310, an insulating film 400, and a cathode 360.

The drift layer 140, the first p-type semiconductor layer 220, and the second p-type semiconductor layer 240 form a mesa structure 180. The mesa structure 180 is, for example, a quadrangular pyramidal trapezoid or a truncated cone trapezoid, and a cross sectional area of the mesa structure 180 in a plan view becomes gradually small in the laminating direction. Thereby, the mesa structure 180 has a forward tapered side face. By forming such a mesa structure 180, an electric field concentration on an end portion of a first anode 320 described later is relaxed, and the breakdown voltage of the semiconductor device 20 can be improved.

Further, by forming the mesa structure as described above, a part of the region where the concentration difference $N_D$-$N_A$ in the drift layer 140 is gradually increased toward the laminating direction, is gradually narrowed toward the laminating direction (toward the first anode 320) as a part of the mesa structure 180. Thereby, the free electrons with improved drift speed in the drift layer 140 can be reliably guided to the first anode 320 side without diffusing them to the outside of the mesa structure 180. As a result, it is possible to further improve a high-speed responsiveness of the semiconductor device 20.

The first anode (p-type contact electrode) 320 of the anode (p-side electrode) 310 is provided on an upper surface of the mesa structure 180, that is, on the second p-type semiconductor layer 240. The first anode 320 includes a material in ohmic contact with the second p-type semiconductor layer 240, and includes, for example, an alloy of palladium (Pd), Pd and nickel (Ni) (Pd/Ni), or an alloy of Ni and gold (Ni/Au).

The insulating film 400 is provided so as to cover the surface of the drift layer 140 outside of the mesa structure 180, the side surface of the mesa structure 180, and a part of the surface of the second p-type semiconductor layer 240 (around the upper surface of the mesa structure 180). Thereby, the insulating film 400 functions to insulate the drift layer 140 and the like from the second anode 340 described later and to protect the drift layer 140 and the like. Note that the insulating film 400 has an opening for bringing the first anode 320 into contact with the second anode 340 described later.

The insulating film 400 of this embodiment has a two-layer structure, for example, so as to have a first insulating film 420 and a second insulating film 440. The first insulating film 420 is configured, for example, as a SOG (Spin On Glass) film formed by a coating method such as a spin coating method. The second insulating film 440 is configured, for example, as a silicon oxide ($SiO_2$) film formed by sputtering or the like.

The second anode (p-side electrode pad) 340 of the anode 310 is in contact with the first anode 320 in the opening of the insulating film 400, and is provided so as to extend to the outside of the first anode 320 on the insulating film 400, and to cover the mesa structure 180. Specifically, the second anode 340 is provided so as to overlap on a part of the surface of the drift layer 140 outside of the mesa structure 180, the side surface of the mesa structure 180, and an upper surface of the mesa structure 180, when the semiconductor device 20 is planarly viewed from above. Thereby, it is possible to suppress the concentration of the electric field in the vicinity of the end portion of the first anode 320 or the pn junction interface near the side surface of the mesa structure 180. Note that the second anode 340 includes, for example, an alloy (Ti/Al) of titanium (Ti) and aluminum (Al).

The cathode 360 is provided on a back side of the substrate 100. The cathode 360 includes a material in ohmic contact with the n-type GaN substrate 100, and includes Ti/Al, for example.

(3) Method for Manufacturing a Nitride Semiconductor Substrate (Method for Manufacturing a Semiconductor Device)

With reference to FIG. 1, FIG. 2, and FIG. 4, a method for manufacturing a nitride semiconductor substrate, and a method for manufacturing a semiconductor device according to this embodiment will be described next.

(Step 1: Preparation of a Substrate)

As shown in FIG. 1, the substrate 100 is prepared as the n-type monocrystalline GaN substrate.

(Step 2: Formation of the Underlying n-Type Semiconductor Layer)

Next, by the following procedure, the nitride semiconductor layer such as the underlying n-type semiconductor layer 120 is formed on the substrate 100, for example using a Metal Organic Vapor Phase Epitaxy (MOVPE) apparatus.

First, the substrate 100 is loaded into a processing chamber of the MOVPE apparatus. Then, hydrogen gas (or mixed gas of hydrogen gas and nitrogen gas) is supplied into the processing chamber of the MOVPE apparatus, and the substrate 100 is heated to a predetermined growth temperature (for example, 1000° C. or more and 1100° C. or less). When the temperature of the substrate 100 reaches a predetermined growth temperature, for example, trimethylgallium (TMG) as a group III organometallic material and ammonia ($NH_3$) gas as a group V material are supplied to the substrate 100. At the same time, for example, monosilane ($SiH_4$) gas is supplied to the substrate 100 as a donor material. Thereby, the underlying n-type semiconductor layer 120 as the n$^+$-type GaN layer is epitaxially grown on the n-type monocrystalline gallium nitride substrate 100 as a GaN substrate. The crystal growth at this time is a homoepitaxial growth in which the same GaN crystal is grown in the laminating direction, and therefore the underlying n-type semiconductor layer 120 having good crystallinity can be formed on the substrate 100.

(Step 3: Formation of the Drift Layer)

Next, the drift layer 140 as an if n$^-$-type GaN layer is epitaxially grown on the underlying n-type semiconductor layer 120. At this time, each growth condition is adjusted so that the donor concentration $N_D$ in the drift layer 140 is $5.0 \times 10^{16}/cm^3$ or less, and the donor concentration $N_D$ in the drift layer 140 is equal to or more than the concentration $N_A$ of the carbons that function as acceptors in the drift layer 140 over the entire area of the drift layer 140, and further the concentration difference $N_D$-$N_A$ in the drift layer 140 is gradually increased in the laminating direction.

Specifically, as shown in FIG. 2 B, the flow rate of the donor material is gradually increased according to the growth of the drift layer 140, so that the donor concentration $N_D$ in the drift layer 140 is gradually increased within a range of $5.0 \times 10^{16}$/cm$^3$ or less in the laminating direction.

Further, the flow rate of the donor material and other growth conditions are relatively adjusted so that the donor concentration $N_D$ in the drift layer 140 is at, least ⅓ times of the total concentration $N_C$ of the carbons over the entire area of the drift layer 140, in consideration of the concentration of the carbons incorporated due to the group III organometallic material. Specifically, the total concentration $N_C$ of carbons can be adjusted by adjusting the flow rate (growth rate) of TMG, the V/III ratio (ratio of the flow rate of the group V material to the flow rate of the group organometallic material), the growth temperature, etc., during the growth of the drift layer 140.

As described above, by satisfying the Mowing three conditions 1) the donor concentration $N_D$ in the drift layer 140 is $5.0 \times 10^{16}$/cm$^3$ or less; 2) the donor concentration $N_D$ in the drift layer 140 is equal to or more than the concentration $N_A$ of the carbons that function as acceptors in the drift layer 140 over the entire area of the drift layer 140; 3) the concentration difference $N_D$-$N_A$ in the drift layer 140 is gradually increased in the laminating direction, the total concentration $N_C$ of the carbons in the drift layer 140 can be arbitrarily distributed in the laminating direction.

For example, as in the case of (A) in FIG. 2 B, the growth condition may be adjusted so that the total concentration $N_C$ of the carbons in the drift layer 140 may be gradually increased in the laminating direction. In this case, specifically, the flow rate of TMG (the growth rate of the drift layer 140) is gradually increased, according to the growth of the drift layer 140. Alternatively, for example, the V/III ratio is gradually decreased according to the growth of the drift layer 140. Alternatively, for example, the growth temperature is gradually lowered according to the growth of the drift layer 140. With such growth conditions, the total concentration $N_C$ of the carbons in the drift layer 140 can be gradually increased in the laminating direction. Since it is necessary to change the total concentration $N_C$ of the carbons to a minute amount, it is preferable not to adjust a growth pressure.

Alternatively, for example, as in the case of (B) FIG. 2 B, the growth conditions other than the donor flow rate may be maintained so that the total concentration $N_C$ of the carbons in the drift layer 140 is constant in the laminating direction. In this case, specifically, the growth rate, the V/III ratio, the growth temperature, and the growth pressure of the drift layer 140 are kept constant, when growing the drift layer 140. With such growth conditions, the total concentration $N_C$ of the carbons in the drift layer 140 can be made constant in the laminating direction.

Alternatively, for example as in the case of (C) in FIG. 2 B, the growth condition may be adjusted so that the total concentration $N_C$ of the carbons in the drift layer 140 is gradually decreased in the laminating direction. In this case, specifically, the flow rate of TMG (the growth rate of the drift layer 140) is gradually decreased, according to the growth of the drift layer 140. Alternatively, for example, the V/III ratio is gradually increased, according to the growth of the drift layer 140. Alternatively, for example, the growth temperature is gradually increased, according to the growth of the drift layer 140. With such growth conditions, the total concentration $N_C$ of the carbons in the drift layer 140 can be gradually decreased toward the laminating direction. In this case as well, since it is necessary to change the total concentration $N_C$ of the carbons to a minute amount, it is preferable not to adjust the growth pressure.

(Step 4: Formation of the First p-type Semiconductor Layer)

Next, the first p-type semiconductor layer 220 as the p-type GaN layer is epitaxially grown on the drift layer 140. At this time, in place of the donor material, for example, biscyclopentadienyl magnesium ($C_{p2}$Mg) is supplied to the substrate 100 as an acceptor material.

(Step 5: Formation of the Second Type Semiconductor Layer)

Next, the second p-type semiconductor layer 240 as a p$^+$-type GaN layer is epitaxially grown on the first p-type semiconductor layer 220 by the same processing procedure as in step 4.

(Step 6: Unloading)

When the growth of the second p-type semiconductor layer 240 is completed, supply of the group III organometallic material and heating of the substrate 100 are stopped. Then, when the temperature of the substrate 100 reaches 500° C. or lower, supply of the group V material is stopped. Thereafter, an atmosphere in the processing chamber of the MOVPE apparatus is replaced with $N_2$ gas and an atmospheric pressure is restored, and the temperature of an inside of the processing chamber is lowered to a temperature at which the substrate can be unloaded, and thereafter the substrate 100 after growth is unloaded from e processing chamber.

The nitride semiconductor substrate 10 of this embodiment is manufactured through the above steps 1 to 6. Thereafter the nitride semiconductor substrate 10 is supplied to a manufacturer or the like of the semiconductor device 20, as an epitaxial wafer for manufacturing the semiconductor device 20.

(Step 7: Manufacture of a Semiconductor Device)

Next, as shown in FIG. 4, a part of the second p-type semiconductor layer 240, the first p-type semiconductor layer 220, and the drift layer 140 is etched by RIE (Reactive Ion Etching), for example. Thereby, the mesa structure 180 is formed on the second p-type semiconductor layer 240, the first p-type semiconductor layer 220, and the drift layer 140. Next, for example, a Pd/Ni film is formed by a sputtering method so as to cover the surfaces of the mesa structure 180 and the drift layer 140, which is then patterned into a predetermined shape. Thereby, the first anode 320 is formed on the upper surface of the mesa structure 180, that is, on the second p-type semiconductor layer 240. Next, for example, an SOG film is formed for example by a spin coating method, and an $SiO_2$ film is formed thereon for example by a sputtering method, so as to cover the surfaces of the mesa structure 180 and the drift layer 140, and thereafter these films are patterned into a predetermined shape. Thereby, the insulating film 400 having the first insulating film 420 and the second insulating film 440 is formed, so as to cover a part of the surface of the drift layer 140 outside of the mesa structure 180, the side surface of the mesa structure 180, and a part of the surface of the second p-type semiconductor layer 240 (around the upper surface of the mesa structure 180). Next, Ti/Al film is formed for example by sputtering, so as to cover the first anode 320 and the insulating film 400 in the opening of the insulating film 400, which is then patterned into a predetermined shape. Thereby, the second anode 340 is formed so as to be in contact with the first anode 320 in the opening of the insulating film 400, and to extend to the outside of the first anode 320 on the insulating film 400, and to cover the mesa structure 180. Further, Ti/Al film is formed on the back side of the substrate 100 for example by sputtering, to thereby form the cathode 360.

The semiconductor device 20 of this embodiment is manufactured through the above step 7.

(4) Effect Obtained by this Embodiment

According to this embodiment, one or a plurality of effects shown below can be obtained.

(a) The donor concentration of the drift layer 140 is $5.0 \times 10^{16}/cm^3$ or less, and is equal to or more than the concentration $N_A$ of the carbons that function as acceptors in the drift layer 140 over the entire area of the drift layer 140 ($N_D \geq N_A$). Thereby, a predetermined amount of the free electrons can be generated over the entire area of the drift layer 140, even if at least a part of the carbons in the drift layer 140 compensates for the donors, in a state that the donor concentration is as low as $5.0 \times 10^{16}/cm^3$ or less. As a result, the drift layer 140 can function as an n-type layer.

(b) The difference $N_D\text{-}N_A$ obtained by subtracting the concentration $N_A$ of the carbons that function as acceptors in the drift layer 140 from the donor concentration $N_D$ in the drift layer 140 is, gradually increased from the substrate 100 side toward the surface side of the drift layer 140. Since the concentration difference $N_D\text{-}N_A$ in the drift layer 140 has such a predetermined distribution, a desired free electron concentration distribution can be obtained, even if at least a part of the carbons in the drift layer 140 compensates for the donors. In this case, for example, the concentration of the free electrons can be gradually increased from the substrate 100 side toward the surface side of the drift layer 140.

(c) Due to the concentration of the free electrons in the drift layer 140 gradually increasing from the substrate 100 side toward the surface side of the drift layer 140, the conduction band of the drift, layer 140 is inclined to be gradually lowered in the laminating direction. Thereby, when forward bias is applied, the free electrons can quickly move to the anode side according to the slope of the conduction band, and the drift speed of the free electrons can be improved. Then, by improving the drift speed of the free electrons, the free electrons are diffused quickly from the underlying n-type semiconductor layer 120 to the first p-type semiconductor layer 220. As a result, it is possible to further improve the high-speed responsiveness of the semiconductor device 20.

In this embodiment, on the premise that the donor concentration of the drift layer 140 is as low as $5.0 \times 10^{16}/cm^3$ or less, the concentration of the free electrons in the drift layer 140 is gradually increased from the substrate 100 side toward the surface side of the drift layer 110 as described above. Thereby, it is possible to improve the high speed responsiveness of the semiconductor device 20 as described above while maintaining the breakdown voltage when reverse bias is applied.

(d) Since the concentration $N_A$ of the carbons that function as acceptors is at least times or more of the total concentration $N_C$ of carbons in the drift layer 140, the donor concentration $N_D$ in the drift layer 140 of this embodiment is ⅓ times or more of the total concentration $N_C$ of the carbons in the drift layer 140 over the entire area of the drift layer 140. Thereby, the amount of the donors in the drift layer 140 can be made larger than the amount compensated by the carbons as acceptors, and a predetermined amount of the free electrons can be generated in the drift layer 140. As a result, it is possible to make the drift layer 140 function as the n-type layer and prevent the resistance of the drift layer 140 from becoming excessively high.

(e) The concentration of hydrogen in the drift layer 140 is $5.0 \times 10^{16}/cm^3$ or less. Thereby, the crystallinity of the drift layer 140 can be improved and the loss of the semiconductor device 20 can be reduced.

Other Embodiment

As described above, embodiments of the present invention have been specifically described. However, the present invention is not limited to the above-described embodiments, and can be variously modified in a range not departing from the gist of the invention.

(a) In the above-described embodiment, explanation is given for a case that the concentration difference $N_D\text{-}N_A$ in the drift layer 140 is linearly increased from the substrate 100 side toward the surface side of the drift layer 140. However, when the concentration difference $N_D\text{-}N_A$ in the drift layer 140 is gradually increased from the substrate 100 side toward the surface side of the drift layer 140, the following modified example may be applied.

Figure 5:
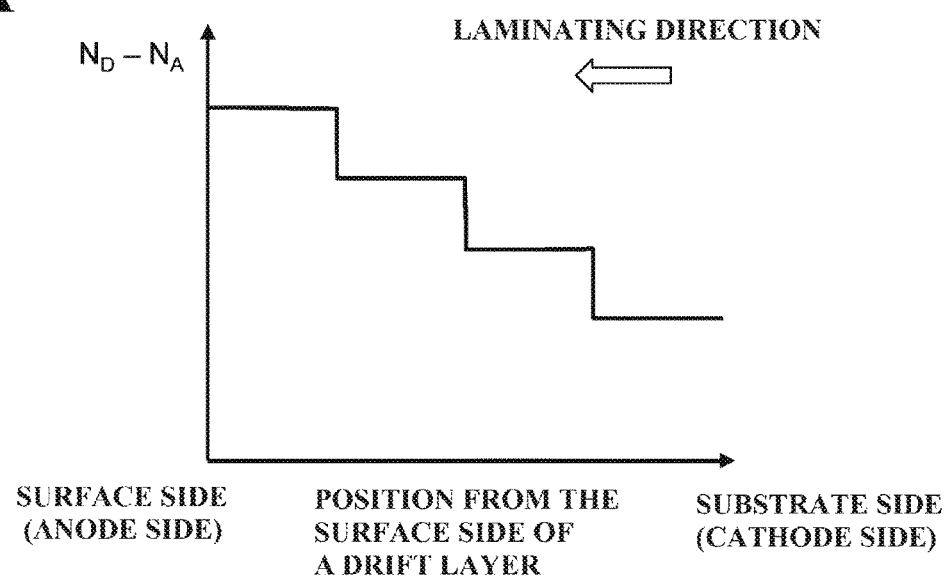
Figure 5:
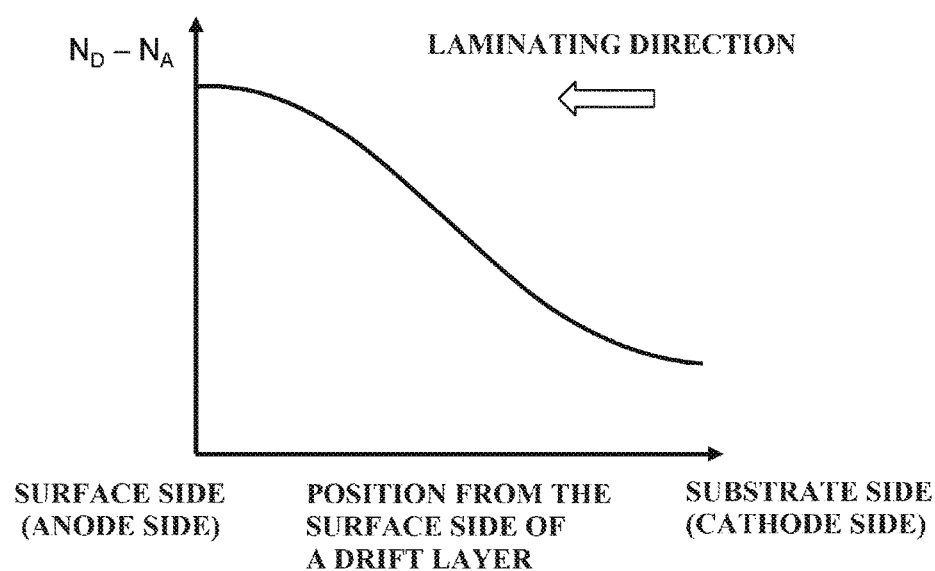

FIG. 5 A is a view showing the difference obtained by subtracting the concentration of the carbons that function as acceptors in the drift layer, from the donor concentration in the drift layer according to a modified example 1.

As shown in the modified example 1 of FIG. 5 A, the concentration difference $N_D\text{-}N_A$ in the drift layer 140 may be increased stepwise from the substrate 100 side toward the surface side of the drift layer 140. In this case, it may be considered that the drift layer 140 is composed of a plurality of layers, and the $N_D\text{-}N_A$ of an upper layer is higher than the $N_D\text{-}N_A$ of a lower layer in two adjacent layers. According to the modified example 1, it is possible to obtain the same effect as the above embodiment. Further, according to the modified example 1, the growth conditions can be switched stepwise according to the growth of the drift layer 140, and it becomes possible to easily control the growth conditions. However, in the modified example 1, the conduction band of the drift layer 140 is also formed stepwise, and therefore it is difficult to improve the drift speed of the free electrons in the portion where the conduction band becomes constant. Accordingly, it is preferable that the concentration difference $N_D\text{-}N_A$ in the drift layer 140 is linearly increased from the substrate 100 side toward the surface side of the drift layer 140 as in the above-described embodiment (FIG. 2 A), in a point that the slope of the conduction band of the drift layer 140 can be smoothed and the drift speed of the free electrons can be improved over the entire drift layer 140.

FIG. 5 B is a view showing the difference obtained by subtracting the concentration of the carbons that function as acceptors in the drift layer, from the donor concentration in the drift layer.

As shown in the modified example 2 of FIG. 5 B, the concentration difference $N_D\text{-}N_A$ in the drift layer 140 may be nonlinearly increased from the substrate 100 side toward the surface side of the drift layer 140. In this case, for example, the gradient of the $N_D\text{-}N_A$ is gradually increased from the substrate 100 side toward an intermediate position of the drift layer 140, and the gradient of the $N_D\text{-}N_A$ is gradually smaller from the intermediate position side of the drift layer 140 toward the surface side of the drift layer 140. Note that the variation in the $N_D\text{-}N_A$ may be a polynomial function, a logarithmic function, an exponential function, or a combination thereof. According to the modified example 2, the same effect as the above embodiment can be obtained. Note that in the above-described embodiment, although the growth condition is linearly changed according to the growth of the drift layer 140, there is also a case that $N_D\text{-}N_A$ is not linearly changed so as to correspond to the growth conditions. In this case, it is difficult to linearly change the $N_D\text{-}N_A$. However, if the concentration difference $N_D\text{-}N_A$ in the drift layer 140 is gradually increased from the substrate 100 side toward the surface side of the drift layer 140, the conduction band of the drift layer 140 can be inclined to be gradually lowered in the laminating direction even if the change of the $N_D\text{·}N_A$ is nonlinear as in the modified example 2. Thereby, also in the modified example 2, the same effect as the above-described embodiment can be obtained.

(b) In the above-described embodiment, explanation is given for case that the nitride semiconductor substrate 10 is configured as a wafer for manufacturing a pn junction diode, and the semiconductor device 20 is configured as a pn junction diode. However, the following modified example 3 may be applied to the nitride semiconductor substrate and the semiconductor device.

Figure 6:
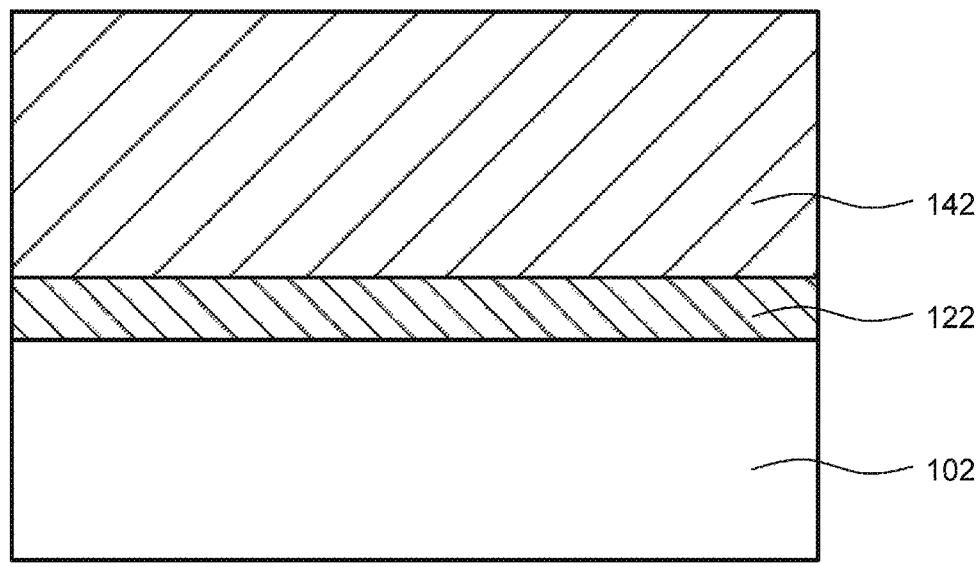
FIG. 6 is a cross-sectional view showing a nitride semiconductor substrate according to a modified example 3.

FIG. 6 is a cross-sectional view showing the nitride semiconductor substrate according to the modified example 3.

As shown in FIG. 6, the nitride semiconductor substrate 12 of the modified example 3 is configured as a wafer for manufacturing a Schottky barrier diode (SBD), and includes for example the substrate 102, the underlying n-type semiconductor layer 122, and the drift layer 142, and does not include the p-type semiconductor layer. The concentration difference $N_D$-$N_A$ in the drift layer 142 is gradually increased from the substrate 102 side toward the surface side of the drift layer 142.

Figure 7:
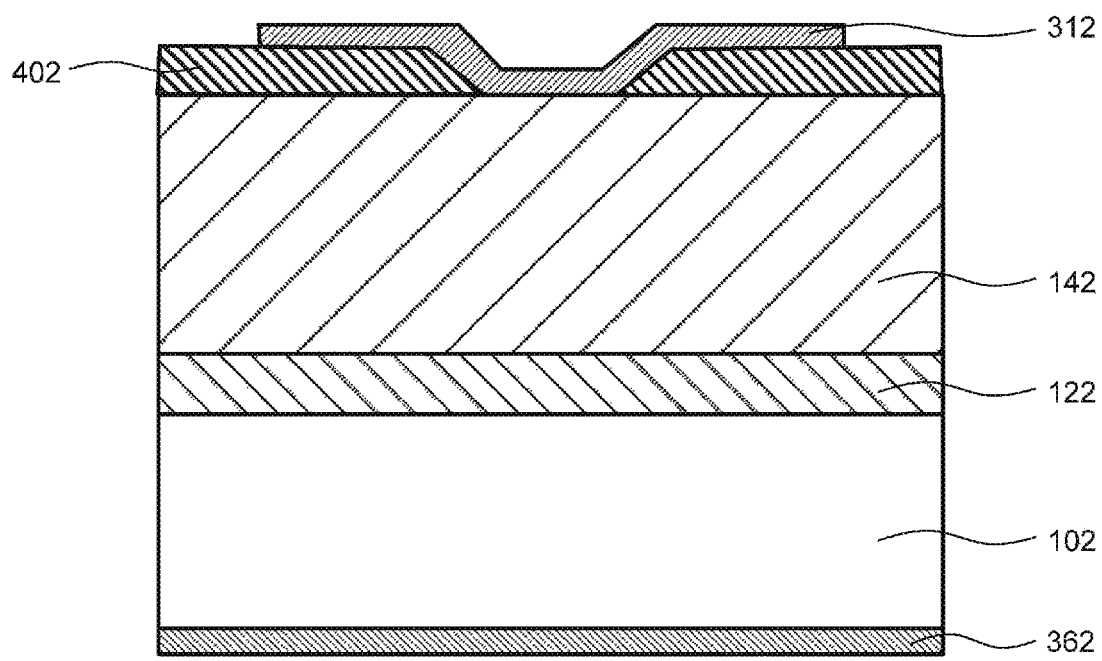
FIG. 7 is a cross-sectional view showing a semiconductor device according to a modified example 3.

FIG. 7 is a cross-sectional view showing a semiconductor device according to the modified example 3.

As shown in FIG. 7, the semiconductor device 22 of the modified example 3 is configured as SRI) manufactured using the above-described nitride semiconductor substrate 12, and includes for example the substrate 102, the underlying n-type semiconductor layer 122, the drift layer 142, the insulating film 402, the anode 312, and the cathode 362. In the modified example 3, the mesa structure as in the above-described embodiment is not formed, and for example the insulating film 402 is provided on a flat surface of the drift layer 142. Further, the insulating film 402 has an opening for bringing the drift layer 142 and the anode 312 into contact with each other. The anode 312 is configured as a so-called field plate electrode. Namely, the anode 312 is in contact with the drift layer 142 in the opening of the insulating film 402 and extends to the outside of the opening of the insulating film 402 on the insulating film 402. Thereby, it is possible to suppress the concentration of the electric field at the end portion of the area where the anode 312 and the drift layer 142 are in contact with each other. The anode 312 is configured to form a Schottky barrier with the drift layer 140, and includes for example Pd, Pd/Ni, or Ni/Au. Further, the cathode 362 is provided on the back side of the substrate 102.

According to the modified example 3, even if the semiconductor device 22 is SBD, it is possible to obtain the same effect as in the above embodiment. Further, SBD bike the semiconductor device 22 of this modified example is known to have a higher switching speed than the pn junction diode. In this modified example, by imparting a gradient to the concentration difference $N_D$-$N_A$ in the drift layer 142, the drift speed of the free electrons in the drift layer 142 can be improved. Accordingly, by improving the drift speed of the free electrons in the drift layer 142, it becomes possible to further improve the switching speed of the semiconductor device 22 configured as SBD.

(c) in the above-described embodiment, explanation is given for a case that the substrate 100 is the n-type GaN substrate. However, the substrate may be configured as a semiconductor substrate other than GaN as long as it is configured as the n-type semiconductor substrate. Specifically, the substrate may be configured as, for example, an n-type SiC substrate. However, in order to improve the crystallinity of the nitride semiconductor layer on the substrate, the substrate is preferably the n-type GaN substrate.

(d) In the above-described embodiment, explanation is given for a case that the underlying n-type semiconductor layer 120 is interposed between the substrate 100 and the drift layer 140. However, the underlying n-type semiconductor layer is not required to be provided. Namely, the drift layer may be directly provided on the substrate.

(e) In the above-described embodiment, explanation is given for a case that the first p-type semiconductor layer 220 and the second p-type semiconductor layer 240 are provided on the drift layer 140. However, the p-type semiconductor layer on the drift layer may be only one layer.

(f) In the above-described embodiment, explanation is given for a case that the nitride semiconductor layer such as the drift layer 140 is formed, by using the MOVPE apparatus. However, the nitride semiconductor layer such as the drift layer 140 may be formed using a hydride vapor phase epitaxy (HVPE) apparatus. However, in this case, when forming the drift layer 140, hydrocarbon gas is supplied to the substrate 100 as a carbon material, and the flow rate of the carbon material is adjusted. Thereby, the total concentration $N_C$ of the carbons in the drift layer 140 can have a predetermined distribution in the laminating direction.

<Preferable Aspects of the Present Invention>

Preferable aspects of the present invention will be supplementarily described hereafter.

(Supplementary Description 1)

There is provided a nitride semiconductor substrate, including:

a substrate configured as an n-type semiconductor substrate; and a drift layer provided on the substrate and configured as a gallium nitride layer containing donors and carbons, wherein a concentration of the donors in the drift layer is $5.0 \times 10^{16}/cm^3$ or less, and is equal to or more than a concentration of the carbons that function as acceptors in the drift layer, over an entire area of the drift layer, and a difference obtained by subtracting the concentration of the carbons that function as acceptors in the drift layer from the concentration of the donors in the drift layer is gradually increased from a substrate side toward a surface side of the drift layer.

(Supplementary Description 2)

There is provided the nitride semiconductor substrate of the supplementary description 1, wherein the concentration of the donors in the drift layer is ⅓ times or more of a total concentration of the carbons in the drift layer over the entire area of the drift layer.

(Supplementary Description 3)

There is provided the nitride semiconductor substrate of the supplementary description 1 or 2, wherein the drift layer contains hydrogen, and a concentration of the hydrogen in the drift layer is $5.0 \times 10^{16}/cm^3$ or less.

(Supplementary Description 4)

There is provided the nitride semiconductor substrate of any one of the supplementary descriptions 1 to 3, wherein the substrate is configured as a monocrystalline gallium nitride substrate.

(Supplementary Description 5)

There is provided the nitride semiconductor substrate of the supplementary description 4, wherein a dislocation density on a main surface of the substrate is $1 \times 10^7/cm^2$ or less.

(Supplementary Description 6)

There is provided the nitride semiconductor substrate of any one of the supplementary descriptions 1 to 5, wherein the concentration of the donors in the drift layer is gradually increased from the substrate side toward the surface side of the drift layer, and the total concentration of the carbons in the drift layer is gradual y increased from the substrate side toward the surface side of the drift layer.

(Supplementary Description 7)

There is provided the nitride semiconductor substrate of any one of the supplementary descriptions 1 to 5, wherein the concentration of the donors in the drift layer is gradually increased from the substrate side toward the surface side of the drift layer, and the total concentration of the carbons in the drift layer is constant from the substrate side toward the surface side of the drift layer.

(Supplementary Description 8)

There is provided the nitride semiconductor substrate of any one of the supplementary descriptions 1 to 5, wherein the concentration of the donors in the drift layer is gradually increased from the substrate side toward the surface side of the drift layer, and the total concentration of the carbons in the drift layer is gradually decreased from the substrate side toward the surface side of the drift layer.

(Supplementary Description 9)

There is provided the nitride semiconductor substrate of any one of the supplementary descriptions 1 to 8, wherein the difference obtained by subtracting the concentration of the carbons that function as acceptors in the drift layer from the concentration of the donors in the drift layer, is linearly increased from the substrate side toward the surface side of the drift layer.

(Supplementary Description 10)

There is provided the nitride semiconductor substrate of any one of the supplementary descriptions 1 to 8, wherein the difference obtained by subtracting the concentration of the carbons that function as acceptors in the drift layer from the concentration of the donors in the drift layer, is increased stepwise from the substrate side toward the surface side of the drift layer.

(Supplementary Description 11)

There is provided the nitride semiconductor substrate of any one of the supplementary descriptions 1 in 8, wherein the difference obtained by subtracting the concentration of the carbons that function as acceptors in the drift layer from the concentration of the donors in the drift layer, is nonlinearly increased from the substrate side toward the surface side of the drift layer.

(Supplementary Description 12)

There is provided a semiconductor device, including:

a substrate configured as an n-type semiconductor substrate; and a drift layer provided on the substrate and configured as a gallium nitride layer containing donors and carbons, wherein a concentration of the donors in the drift layer is $5.0 \times 10^{16}/cm^3$ or less, and is equal to or more than a concentration of the carbons that function as acceptors in the drift layer over an entire area of the drift layer, and a difference obtained by subtracting the concentration of the carbons that function as acceptors in the drift layer from the concentration of the donors in the drift layer is gradually increased from the substrate side toward the surface side of the drift layer.

(Supplementary Description 13)

There is provided a method for manufacturing a nitride semiconductor substrate, including:

forming a drift layer as a gallium nitride layer containing donors and carbons, on an n-type semiconductor substrate wherein in the forming the drift layer, a concentration of the donors in the drift layer is set to be equal to or more than a concentration of the carbons that function as acceptors in the drift layer over an entire area of the drift layer, while e concentration of the donors in the drift layer is set to $5.0 \times 10^{16}/cm^3$ or less, and a difference obtained by subtracting the concentration of the carbons that function as acceptors in the drift layer from the concentration of the donors in the drift layer, is gradually increased from a substrate side toward a surface side of the drift layer.

(Supplementary Description 14)

There is provided a method for manufacturing a semiconductor device, including:

forming a drift layer as a gal hum nitride layer containing donors and carbons on an n-type semiconductor substrate, wherein in the forming the drift layer, a concentration of the donors in the drift layer is set to be equal to or more than a concentration of the carbons that function as acceptors in the drift layer over an entire area of the drift layer, while the concentration of the donors in the drift, layer is set to $5.0 \times 10^{16}/cm^3$ or less, and a difference obtained by subtracting the concentration of the carbons that function as acceptors in the drift layer from the concentration of the donors in the drift layer, is gradually increased from the substrate side toward the surface side of the drift, layer.

DESCRIPTIONS OF SIGNS AND NUMERALS 10, 12 Nitride semiconductor substrate
20, 22 Semiconductor device
100, 102 Substrate
140, 142 Drift layer

What is claimed is:

1. A nitride semiconductor substrate, comprising:

a substrate configured as an n-type semiconductor substrate; and a drift layer provided on the substrate and configured as a gallium nitride layer containing donors and carbons, wherein a concentration of the donors in the drift layer is $5.0 \times 10^{16}/cm^3$ or less, and is equal to or more than a concentration of the carbons that function as acceptors in the drift layer, over an entire area of the drift layer, and difference obtained by subtracting the concentration of the carbons that function as acceptors in the drift layer from the concentration of the donors in the drift layer, is gradually increased from a substrate side toward a surface side of the drift layer.

2. The nitride semiconductor substrate according to claim 1, wherein the concentration of the donors in the drift, layer is ⅓ times or more of a total concentration of the carbons in the drift layer over the entire area of the drift layer.

3. The nitride semiconductor substrate according to claim 1, wherein the drift layer contains hydrogen, and a concentration of the hydrogen in the drift layer is $5.0 \times 10^{16}/cm^3$ or less.

4. A semiconductor device, comprising the nitride semiconductor substrate according to claim 1.

5. A method for manufacturing the nitride semiconductor substrate according to claim 1, comprising:

forming the drift layer as the gallium nitride layer containing donors and carbons on the n-type semiconductor substrate.

6. The nitride semiconductor substrate according to claim 1, wherein the concentration of the donors in the drift layer is gradually increased from the substrate side toward the surface side of the drift layer, and a total concentration of the carbons in the drift layer is gradually increased from the substrate side toward the surface side of the drift layer.

7. The nitride semiconductor substrate according to claim 1, wherein the concentration of the donors in the drift layer is gradually increased from the substrate side toward the surface side of the drift layer, and a total concentration of the carbons in the drift layer is constant from the substrate side toward the surface side of the drift layer.

8. The nitride semiconductor substrate according to claim 1, wherein the concentration of the donors in the drift layer is gradually increased from the substrate side toward the surface side of the drift layer, and a total concentration of the carbons in the drift layer is gradually decreased from the substrate side toward the surface side of the drift layer.

9. The nitride semiconductor substrate according to claim 1, wherein the difference obtained by subtracting the concentration of the carbons that function as acceptors in the drift, layer from the concentration of the donors in the drift, layer, is monotonically increased from the substrate side toward the surface side of the drift layer.

10. The nitride semiconductor substrate according to claim 9, wherein the difference obtained by subtracting the concentration of the carbons that function as acceptors in the drift layer from the concentration of the donors in the drift layer, is linearly increased from the substrate side toward the surface side of the drift layer.

11. The nitride semiconductor substrate according to claim 1, wherein the difference obtained by subtracting the concentration of the carbons that function as acceptors in the drift layer from the concentration of the donors in the drift layer, is increased stepwise from the substrate side toward the surface side of the drift layer.

12. The nitride semiconductor substrate according to claim 1, wherein the difference obtained by subtracting the concentration of the carbons that function as acceptors in the drift layer from the concentration of the donors in the drift layer, is nonlinearly increased from the substrate side toward the surface side of the drift layer.

* * * * *

UNITED STATES PATENT AND TRADEMARK OFFICE
CERTIFICATE OF CORRECTION

PATENT NO. : 10,770,554 B2
APPLICATION NO. : 16/088206
DATED : September 8, 2020
INVENTOR(S) : Yoshinobu Narita It is certified that error appears in the above-identified patent and that said Letters Patent is hereby corrected as shown below:

In the Specification

Column 1, Line 21, "diodes (SBD)) and pn" should read -- diodes (SBD) and pn --

Column 4, Line 21, "an n⁺type GaN" should read -- an $n^+$ ·type GaN --

Column 4, Line 30, "to the group ill" should read -- to the group III --

Column 6, Line 13, "cm or inure and" should read -- $cm^3$ or more and --

Column 7, Line 56, "more than times of" should read -- more than 1/3 times of --

Column 7, Line 58, "drift layer 100 may be" should read -- drift layer 140 may be --

Column 7, Line 59, "drift layer 110." should read -- drift layer 140. --

Column 7, Line 63, "drift layer 110. Thereby," should read -- drift layer 140. Thereby, --

Column 8, Line 57, "$5.0 \times 10^{14}$ $cm^{-3}$ · $\mu m^-$" should read -- $5.0 \times 10^{14}$ $cm^{-3}$ · $\mu m^{-1}$, --

Column 9, Line 29, "drift layer 110." should read -- drift layer 140 --

Column 10, Line 27, "drift layer 110 can be" should read -- drift layer 140 can be --

Column 10, Line 37, "drift layer 110 is, for" should read -- drift layer 140 is, for --

Column 17, Line 25, "configured as SRI) manufactured" should read -- configured as SBD manufactured --

Signed and Sealed this
Eighth Day of December, 2020

Andrei Iancu
*Director of the United States Patent and Trademark Office*